United States Patent [19]
Hanatani

[11] Patent Number: 6,111,428
[45] Date of Patent: Aug. 29, 2000

[54] PROGRAMMABLE LOGIC ARRAY

[75] Inventor: Shingo Hanatani, Tokyo, Japan

[73] Assignee: Kabushiki Kaisha Toshiba, Kawasakishi, Japan

[21] Appl. No.: 09/119,625

[22] Filed: Jul. 21, 1998

[30]     Foreign Application Priority Data

Jul. 22, 1997 [JP] Japan ..................................... 9-195948

[51] Int. Cl.[7] ........................... G06F 7/38; H03K 19/177; H03K 19/094
[52] U.S. Cl. .................................. 326/39; 326/44; 326/45
[58] Field of Search ................................. 326/39, 44, 45, 326/49, 50

[56]             References Cited

U.S. PATENT DOCUMENTS 4,902,918 2/1990 Sugeno et al. .......................... 307/468

Primary Examiner—Michael Tokar
Assistant Examiner—Daniel D. Chang
Attorney, Agent, or Firm—Oblon, Spivak, McClelland, Maier & Neustadt, P.C.

[57]             ABSTRACT

There is provided a programmable logic array in which a precharge circuit is provided separately from precharge transistors. The precharge circuit can connect the one of wirings connecting memory cell transistors out of the memory cell transistor group constituting an AND plane to a power supply voltage at a same timing as that of the precharge transistors. Accordingly, the programmable logic array having the AND plane which can prevent variation of an output by improving charge share tolerance can be provided.

6 Claims, 6 Drawing Sheets

PROGRAMMABLE LOGIC ARRAY

BACKGROUND OF THE INVENTION

1. Field of the Invention

The present invention relates to a programmable logic array and, more particularly, a programmable logic array which is excellent in charge share tolerance.

2. Description of the Prior Art

FIG. 4 is a circuit diagram showing a configuration of an AND plane of a programmable logic array (called as "PLA" hereinafter) in the prior art. The AND plane of this PLA comprises p-ch MOS transistors (precharge transistors) P1 to P3 . . . whose one ends are connected to a power supply voltage VDD; n-ch MOS transistors (discharge transistors) N1 to N3 . . . whose one ends are connected to a ground voltage GND; a plurality of n-ch MOS transistors (memory cell transistors) N101 to N107 . . . which are series-connected between the precharge transistors P1 to P3 . . . and the discharge transistors N1 to N3 . . . and which constitute an AND plane; output lines BL1 to BL3 . . . of the AND plane; and read buffer cells Buf1 to Buf3 . . . which are connected to the output lines BL1 to BL3 . respectively.

Address lines A11, A11V, A10, A10V, . . . , A0, A0V are input into a plurality of n-ch MOS transistors N101 to N107 . . . constituting the AND plane of the PLA. Where "V" of A11V means an inversion of A11, i.e., A11V means an inverted signal of A11 and this terminology is similarly true of other signals in the following. And, all the series-connected memory cell transistors which are connected to the same output line are turned into their ON states only when a particular address is input thereinto. Accordingly, levels of the output lines BL1 to BL3 . . . of the AND plane can be defined by input signals from the address lines A11, A11V, A10, A10V, . . . , A0, A0V and then these levels are transferred to an OR plane (not shown), for example.

In such AND plane of the PLA, according to a precharge signal PRE serving as a clock, precharge of respective output lines BL1 to BL3 . . . is carried out in a precharge period (PRE="1") as a former half of a clock cycle, and then data are output from respective output lines BL1 to BL3 . . . to the OR plane, etc. in a discharge period (PRE="0") as a latter half thereof.

More particularly, at first, when the precharge signal PRE is shifted to "1" (i.e., PREV="0"), the precharge transistors P1 to P3 . . . which receive PREV at their gates are turned into their ON states. Since one ends of the precharge transistors P1 to P3 . . . are connected to the power supply voltage VDD and the other ends of the precharge transistors P1 to P3 . . . are connected to the output lines BL1 to BL3 . . . , the output lines BL1 to BL3 . . . can be charged up to "1" respectively. The address data can also updated in this precharge period. Since such PREV which are input to gates of the precharge transistors P1 to P3 . . . is also input to gates of the discharge transistors N1 to N3 . . . , there is no case where both the precharge and discharge transistors are turned into their ON states at the same time. For this reason, even if address data to the memory cells are updated such that all the memory cell transistors being connected to the same output line, as described above, are turned into their ON states, no DC route is produced from the power supply voltage VDD to the ground voltage GND in the precharge period.

Next, the precharge signal PRE is shifted to "0" (i.e., PREV="1"), the precharge transistors P1 to P3 . . . are turned into their OFF states and also the discharge transistors N1 to N3 . . . are turned into their ON states. Therefore, the output lines, whose address data are updated such that all the memory cell transistors being connected to such output lines are turned into their ON states, can discharge their holding data "1" to the ground voltage GND via the discharge transistors. In contrast, since connection to the ground voltage GND is cut off via any memory cell transistor being connected to the output lines, the output lines whose address data other than the above address data are updated can still hold the data "1".

In this way, the AND plane of the PLA in the prior art can output information.

However, there have been following problems in the AND plane of the PLA in the prior art. Such problems will be explained with reference to FIGS. 5 and 6 hereinafter.

FIG. 5 is a circuit diagram showing an example of a placement of precharge transistors, memory cell transistors, discharge transistors, and read buffer cells, which are connected to one output line of the AND plane shown in FIG. 4 in the prior art. As shown in FIG. 5, in this example, the memory cell transistors N108 to N119 are placed alternatively every other address line.

In such placement of the memory cell transistors, for example, the case will be discussed where the address data of respective memory cell transistors are updated such that only the memory cell transistor N119 is turned into its OFF state and remaining memory cell transistors N108 to N118 are turned into their ON states. In the case of these address data, as described above, in principle the output line BL4 and drain (source) capacitances of the memory cell transistors N108 to N118 would be charged up to "1" in the precharge period and then "1" would be output from the output line BL4 in the discharge period.

However, as shown in FIG. 6, since the precharge period and the address transition period are overlapped with each other, in case the memory cell transistors N108, N109 positioned in the vicinity of the precharge transistor P4 are turned into their ON states lastly immediately before an end of the precharge period, charging operations of all drain (source) capacitances of the memory cell transistors N108 to N118 cannot be completed in a remaining precharge period (period indicated by t2–t1 in FIG. 6). As a result, charge share is caused and thus the situation that the data held on the output line BL4 is changed from "1" to "0" will be caused. Therefore, essentially the output line has to output "1" but it would output "0", whereby a malfunction of the PLA would be brought about.

Hence, in order to prevent the above mentioned phenomenon, there can be thought out such an approach that, even when the above charge share is caused, the output line BL4 can continue to keep "1" by increasing a parasitic capacitance of the output line BL4, e.g., drain (source) capacitance of the precharge transistor P4. However, this means that a capacitance which must be discharged at the time of reading (in the discharge period) is increased conversely, so that a read rate is widely reduced.

In contrast, in order to carry out the necessary precharge sufficiently, there can be thought out another approach that transition of the address can be finished at the timing which is sufficiently earlier than the end of the precharge period. However, there has been a problem that this approach casts a burden upon a setup time of the address and thus a time used for calculation, etc. must be wasted.

SUMMARY OF THE INVENTION

The present invention has been made in light of the above circumstances and it is an object of the present invention to provide a programmable logic array having an AND plane which can prevent variation of an output by improving charge share tolerance.

In order to achieve the above object, according to the present invention, there is provided a programmable logic array comprising an AND plane having a group of memory cell transistors consisting of a plurality of series-connected memory cell transistors whose one ends are used as output terminals respectively, the one ends of the plurality of series-connected memory cell transistors being connected to a power supply voltage via precharge transistors respectively, and other ends of the plurality of series-connected memory cell transistors being connected to a ground voltage via discharge transistors respectively; and at least one precharge circuit which is connected to one of wirings connecting memory cell transistors out of the memory cell transistor group and which connect the one of wirings to the power supply voltage at a same timing as that of the precharge transistors.

According to a features of the present invention, the precharge circuit is provided separately from the precharge transistors. The precharge circuit is connected to one of the wirings connecting the memory cell transistors such that precharging operation can be performed by the precharge circuit at the same timing of the precharge transistors. As a result, variation in the output due to the charge share, which is the problem in the prior, art can be prevented. More particularly, even in the event that the memory cell transistor located near the precharge transistor is shifted into its ON state lastly immediately before an end of the precharge period, a precharging operation can also be conducted by the precharge circuit. Therefore, even if the charge share is caused, the situation that data "1" held by the output line is lowered to such an extent that data "1" is misconceived as data "0" can be eliminated.

It is preferable in performance of the circuit that the precharge circuit should be composed of the p-ch MOS transistor which is the same conductivity type as the precharge transistors. Also, it is preferable in layout size reduction that the precharge circuit should be composed of the n-ch MOS transistor which is the same conductivity type as the memory cell transistors.

Also, the feature of the present invention can also be applied to a programmable logic array which comprises the AND plane having a group of memory cell transistors consisting of a plurality of series—connected memory cell transistors whose one ends are used as output terminals respectively, the one ends of the plurality of series—connected memory cell transistors being connected to a power supply voltage via first precharge transistors respectively, and other ends of the plurality of series-connected memory cell transistors being connected to a ground voltage via discharge transistors respectively and also connected to the power supply voltage via second precharge transistors respectively.

DESCRIPTION OF THE PREFERRED EMBODIMENTS

Programmable logic arrays according to embodiments of the present invention will be explained with reference to the accompanying drawings hereinafter.

Figure 1:
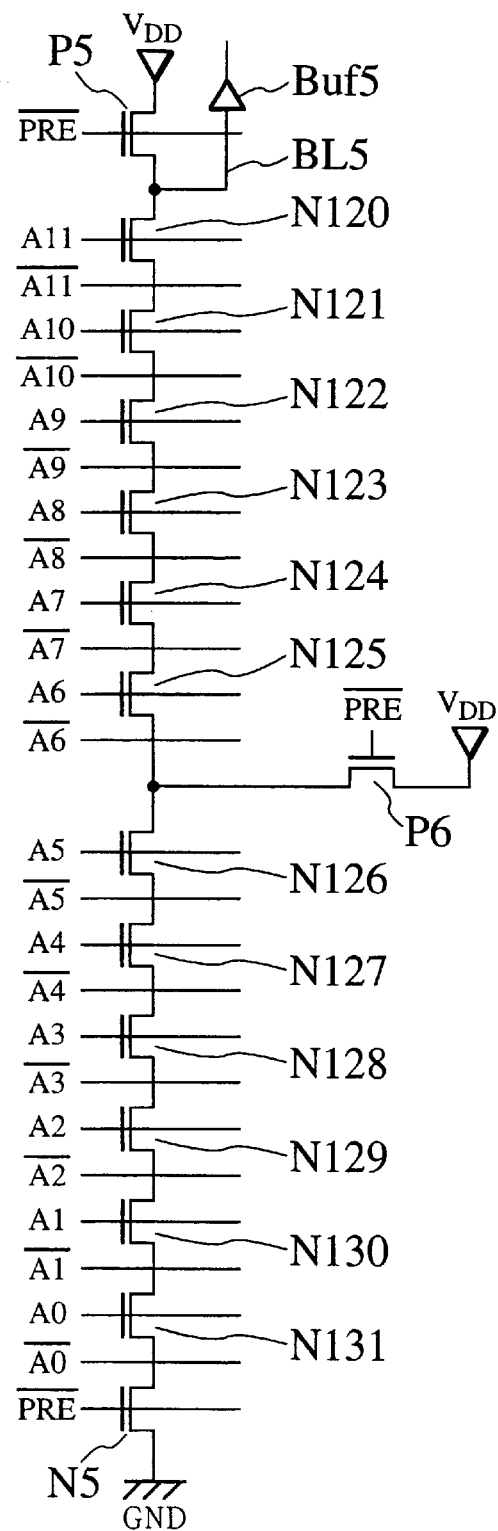
FIG. 1 is a circuit diagram showing a placement of precharge transistors, memory cell transistors, discharge transistors, and read buffer cells which are connected to one output line constituting an AND plane of a programmable logic array according to a first embodiment of the present invention.

FIG. 1 is a circuit diagram showing a placement of precharge transistors, memory cell transistors, discharge transistors, and read buffer cells which are connected to one output line constituting an AND plane of a programmable logic array according to a first embodiment of the present invention. The case is also shown herein where the memory cell transistors N120 to N131 are placed alternatively every other address line.

As shown in FIG. 1, the first embodiment of the present invention comprises a p-ch MOS transistor (precharge transistor) P5 whose one end is connected to the power supply voltage VDD: an n-ch MOS transistor (discharge transistor) N5 whose one end is connected to the ground voltage GND: a plurality of n-ch MOS transistors (memory cell transistors) N120 to N131 which are series-connected between the precharge transistor P5 and the discharge transistor N5 and which constitute the AND plane; an output line BL5 of the AND plane; and a read buffer cell Buf5 which is connected to the output line BL5.

Up to now the explanation can be made in the same way as the prior art. However, in addition to the above, a p-ch MOS transistor (precharge transistor) P6 connected to a wiring between the memory cell transistors is provided separately in the present embodiment. This respect is truly a distinguishing feature of the present invention. In FIG. 1, the precharge transistor P6 is provided at an intermediate stage of the memory cell transistors which are series-connected, i.e., is connected to the wiring between the memory cell transistor N125 and the memory cell transistor N126. An operation of this precharge transistor P6 will be explained hereinafter. Basic operations (precharge operation and discharge operation) of the AND plane are similar to those in the prior art and therefore their explanation will be omitted.

The case will be discussed where the address data of respective memory cell transistors are updated such that only the memory cell transistor N131 is turned into its OFF state and remaining memory cell transistors N120 to N130 are turned into their ON states. In the prior art, if the memory cell transistors N120, N121 located in the vicinity of the precharge transistor P5 are turned into their ON states lastly immediately before an end of the precharge period, charging operations of all drain (source) capacitances of the memory cell transistors N121 to N130 cannot be completed in a remaining precharge period. As a result, charge share is caused and thus the situation that the data held on the output line BL5 is changed from "1" to "0" will be caused. However, in the first embodiment, the precharge transistor P6 which receives PREV at its gate is held at its ON state in the precharge period. Therefore, even if the memory cell transistors N120, N121 positioned in the vicinity of the precharge transistor P5 are turned into their ON states lastly immediately before the end of the precharge period, drain (source) capacitances of the memory cell transistors other than the memory cell transistors N120, N121 have already been charged up to "1" by the precharge transistor P5. As a consequence, there is no chance of causing the charge share unlike the prior art, and thus data "1" can be output correctly from the output line BL5.

Like the above, in the first embodiment of the present invention, since the precharge transistor P6 is provided at an intermediate stage of the series-connected memory cell transistors, variation in the output due to the charge share, as the problem in the prior art, can be prevented. Nevertheless, the charge share may be still caused in the first embodiment. More particularly, such charge share will be caused in the event that the memory cell transistors located near the precharge transistor P5 and the memory cell transistors located near the precharge transistor P6 are simultaneously shifted into their ON states lastly immediately before the end of the precharge period. However, this situation is considerably hard to occur rather than the prior art. It is possible to say that, even if taking account of this respect, the first embodiment can make an appreciable improvement upon the prior art.

Furthermore, even if the memory cell transistors located near the precharge transistor P5 and the memory cell transistors located near the precharge transistor P6 are simultaneously turned into their ON states lastly immediately before the end of the precharge period, variation in the output due to the charge share can be substantially prevented. The reasons are that the capacitance to be charged after the address has been updated can be reduced considerably smaller than the prior art (i.e., reduced to about half since the precharge transistor is provided at the intermediate stage of the memory cell transistors in this embodiment) and that, because of the presence of data "1" held by two memory cell transistors (i.e., memory cell transistors N125 and N126 in this embodiment) near the precharge transistor P6, it is ready to avoid the situation that data of the output line BL5 is lowered to a level which is misconceived as "0".

Figure 2:
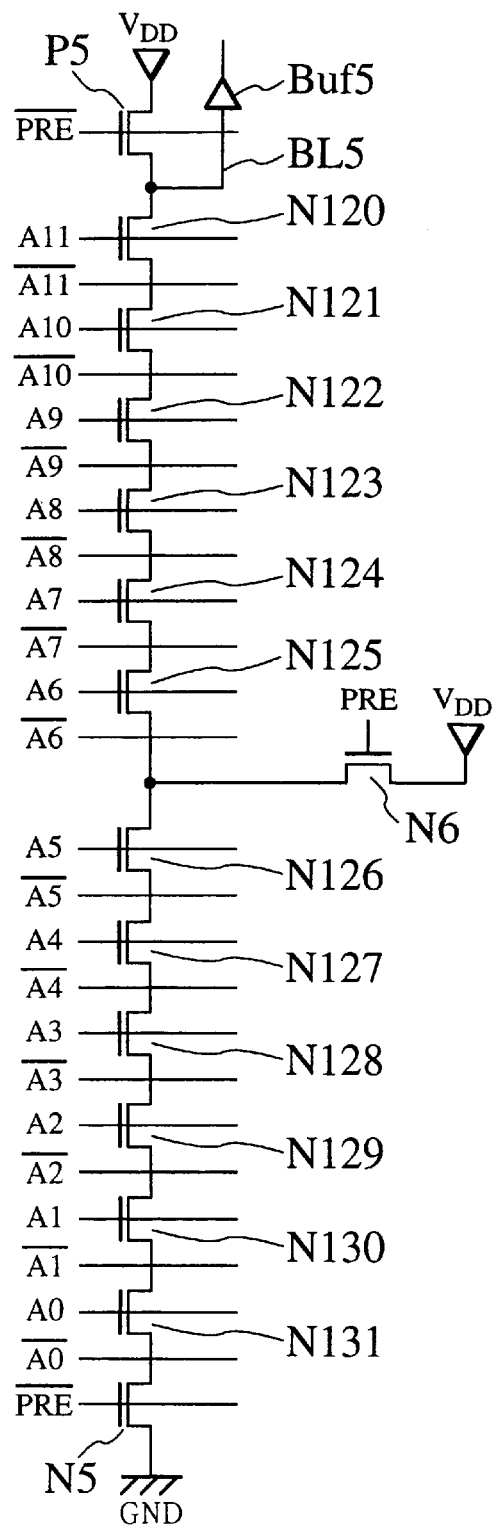
FIG. 2 is a circuit diagram showing a placement of precharge transistors, memory cell transistors, discharge transistors, and read buffer cells which are connected to one output line constituting an AND plane of a programmable logic array according to a second embodiment of the present invention.

FIG. 2 is a circuit diagram showing a placement of precharge transistors, memory cell transistors, discharge transistors, and read buffer cells which are connected to one output line constituting an AND plane of a programmable logic array according to a second embodiment of the present invention. The case is also shown herein where the memory cell transistors N120 to N131 are placed alternatively every other address line.

The second embodiment has a configuration in which the p-ch MOS transistor constituting the precharge transistor P6 in the first embodiment is replaced by an n-ch MOS transistor constituting a precharge transistor N6. Since the precharge transistor N6 receives PRE at its gate, it can execute the same ON/OFF operation as the precharge transistor P6 in the first embodiment.

If the precharge transistor is provided separately by the n-ch MOS transistor like the second embodiment, the AND plane can be constructed by the n-ch MOS transistors only. Accordingly, reduction in layout size can be achieved in comparison with the first embodiment. This is because, in case the precharge transistor is formed of the p-ch MOS transistor which has different conductivity from the memory cell transistors like the above first embodiment, an n-well, for example, must be formed separately to form the p-ch MOS transistor and thus the layout size is increased correspondingly.

Figure 3:
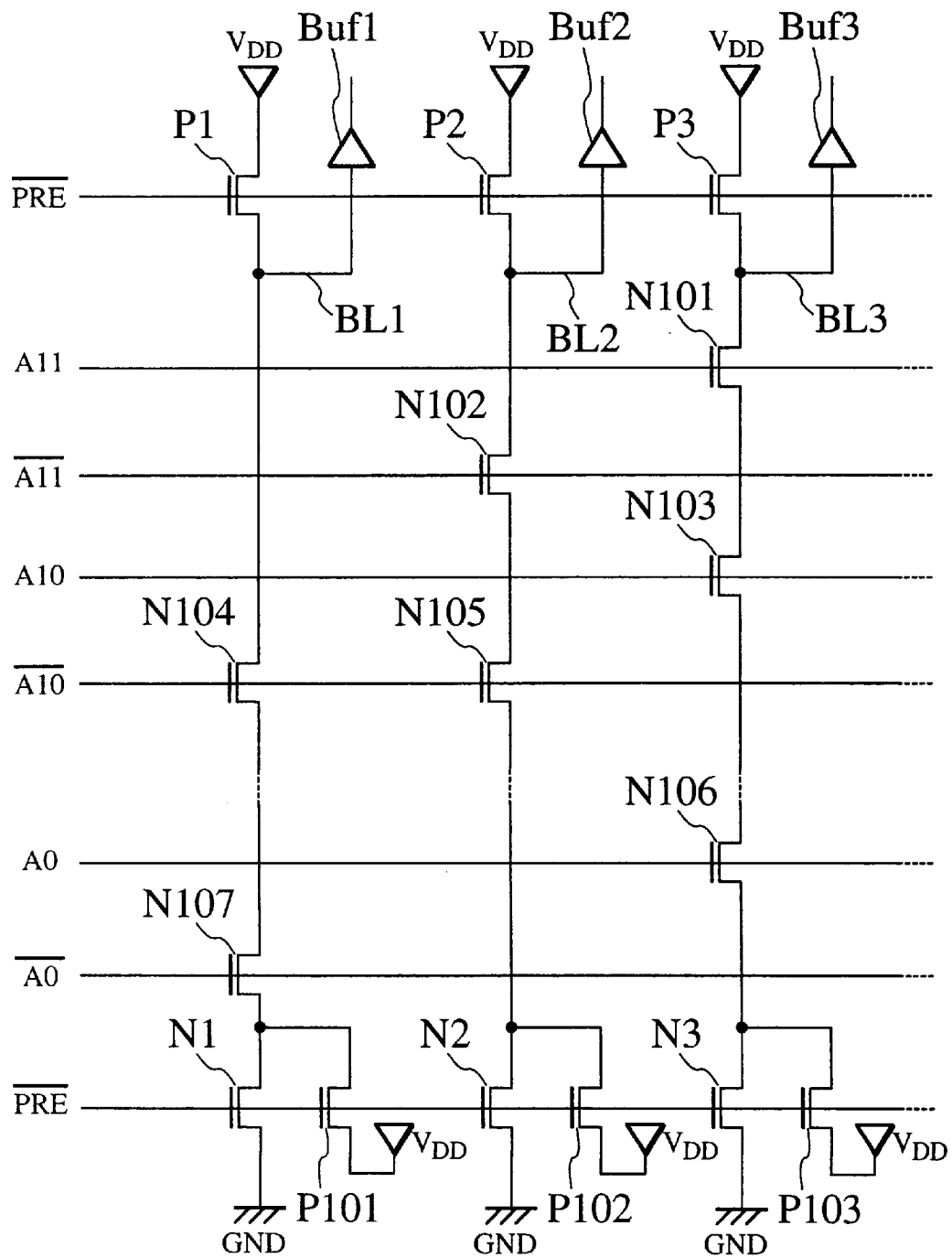
FIG. 3 is a circuit diagram showing a configuration of an AND plane of a programmable logic array according to a third embodiment of the present invention.
Figure 4:
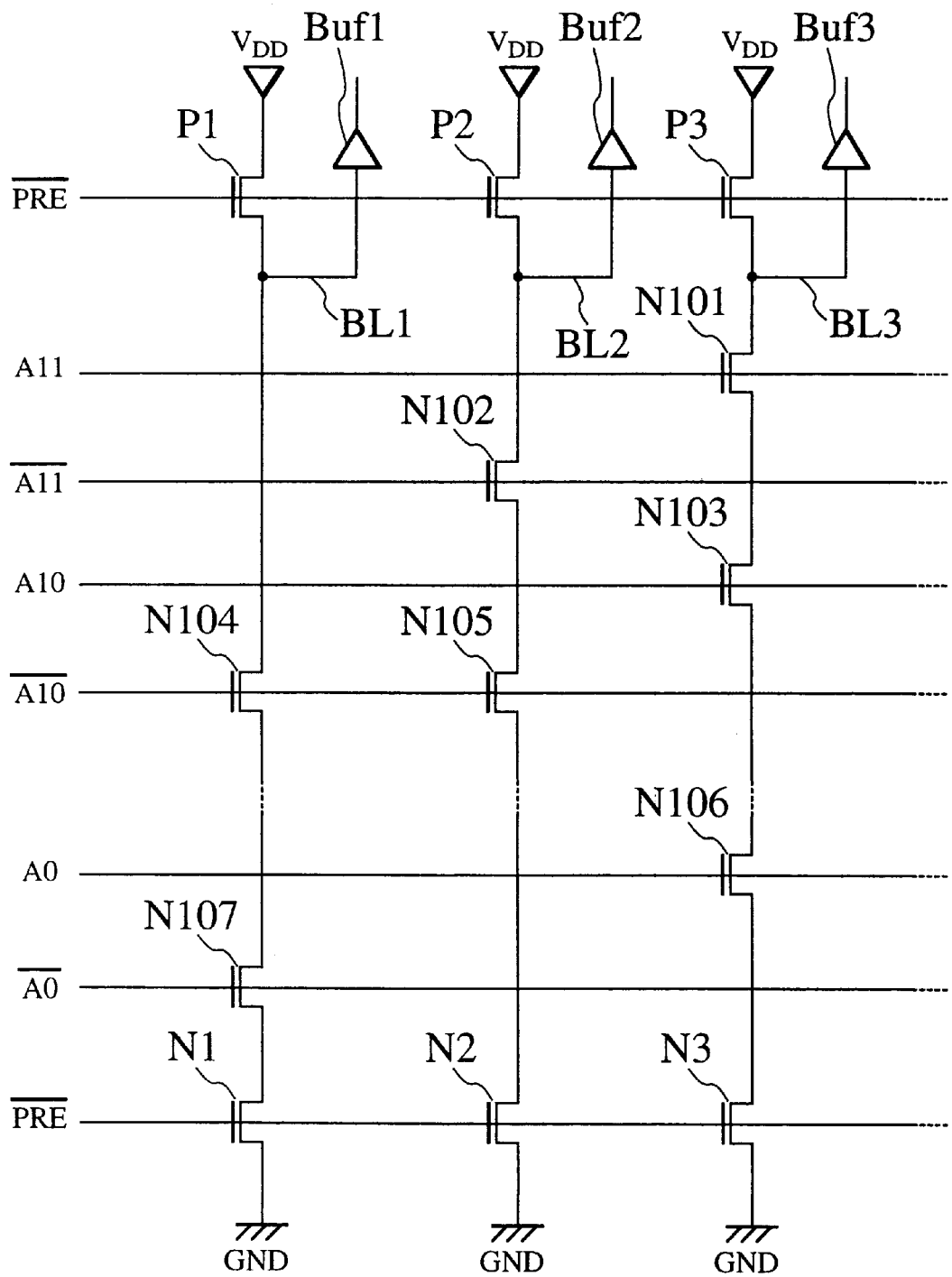
FIG. 4 is a circuit diagram showing a configuration of an AND plane of a programmable logic array in the prior art.
Figure 5:
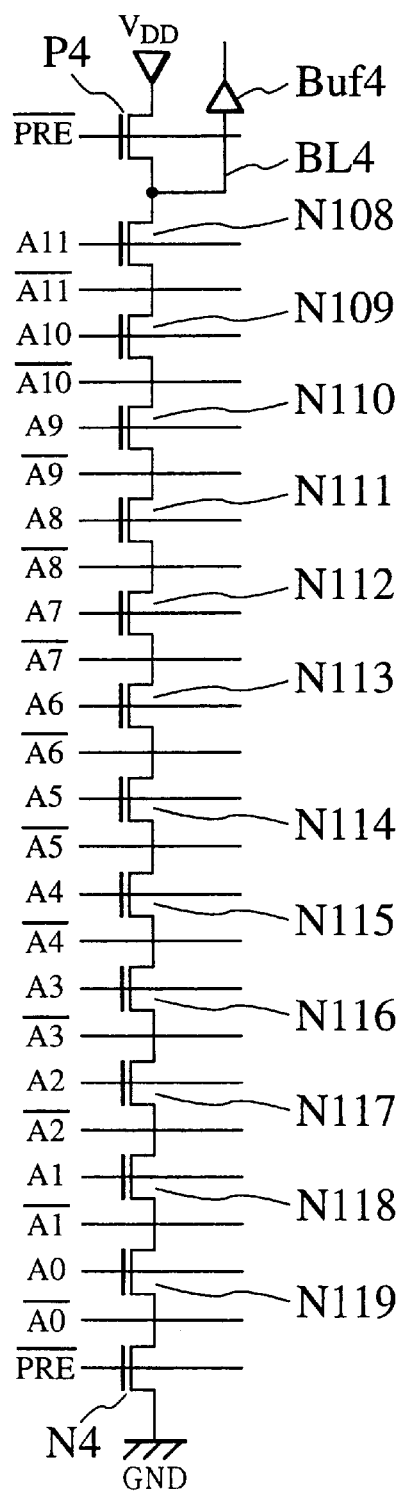
FIG. 5 is a circuit diagram showing an example of a placement of precharge transistors, memory cell transistors, discharge transistors, and read buffer cells which are connected to one output line of the AND plane of the programmable logic array shown in FIG. 4.
Figure 6:
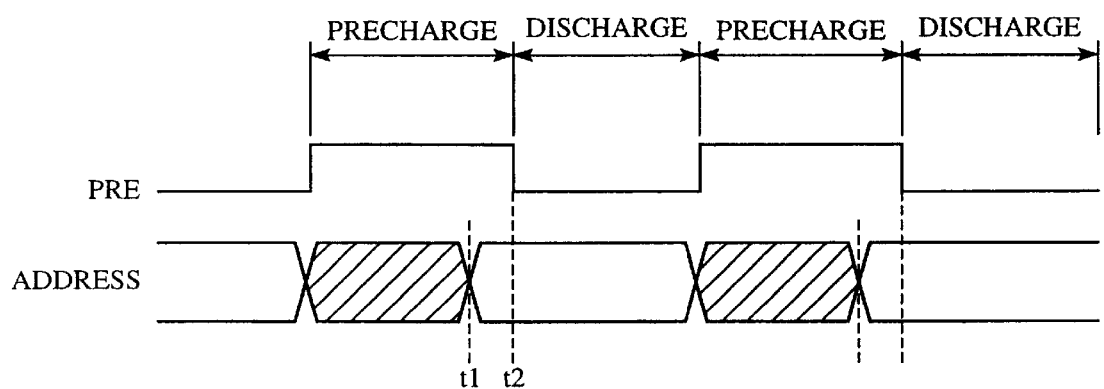
FIG. 6 is a timing chart showing an operation of the AND plane shown in FIG. 4 in the prior art.

The present invention is not limited to the above first and second embodiments. By way of example, the similar advantages can be achieved by the AND plane in which the precharging operation is commenced from both ends of the series-connected memory cell transistors, as shown in FIG. 3.

Also, although the precharge transistor has been provided separately by the n-ch MOS transistor or p-ch MOS transistor in the above first and second embodiments, the present invention is not limited to such n-ch MOS transistor or p-ch MOS transistor. Any circuit configuration may be employed if it can carry out the same operation as such precharge transistor.

Further, although the precharge transistor provided separately in the above first and second embodiments has been connected to the intermediate stage of the series-connected memory cell transistors, connection location is not limited to such intermediate stage.

Furthermore, although one precharge transistor or precharge circuit has been provided separately in the above first and second embodiments, a plurality of precharge transistors or precharge circuits may be provided.

As explained above, according to the present invention, in the AND plane of the programmable logic array, since the precharge circuit in addition to the precharge transistors is connected separately to any location of a group of memory cell transistors and then the precharging operation is also performed by such precharge circuit, the charge share tolerance can be improved. In addition, variation of the output therefrom can be prevented.

What is claimed is:

1. A programmable logic array comprising:

an AND plane having a group of memory cell transistors consisting of a plurality of series-connected memory cell transistors whose one ends are used as output terminals respectively, the one ends of the plurality of series-connected memory cell transistors being connected to a power supply voltage via precharge transistors respectively, and other ends of the plurality of series-connected memory cell transistors being connected to a ground voltage via discharge transistors respectively; and at least one precharge circuit which is connected to one of wirings located between and connecting adjacent memory cell transistors out of the memory cell transistor group and which connect the one of wirings to the power supply voltage at a same timing as that of the precharge transistors.

2. A programmable logic array according to claim 1, wherein the precharge circuit is formed of a p-ch MOS transistor which is connected between the wiring and the power supply voltage and whose gate receives a same signal as that being input into a gate of the precharge transistor.

3. A programmable logic array according to claim 1, wherein the precharge circuit is formed of an n-ch MOS transistor which is connected between the wiring and the power supply voltage and whose gate receives an inverted signal of a signal being input into a gate of the precharge transistor.

4. A programmable logic array comprising:

an AND plane having a group of memory cell transistors consisting of a plurality of series-connected memory cell transistors whose one ends are used as output terminals respectively, the one ends of the plurality of series-connected memory cell transistors being connected to a power supply voltage via first precharge transistors respectively, and other ends of the plurality of series-connected memory cell transistors being connected to a ground voltage via discharge transistors respectively and also connected to the power supply voltage via second precharge transistors respectively; and at least one precharge circuit which is connected to one of wirings located between and connecting adjacent memory cell transistors out of the memory cell transistor group and which connected the one of wirings to the power supply voltage at a same timing as that of the precharge transistors.

5. A programmable logic array according to claim 4, wherein the precharge circuit is formed of a p-ch MOS transistor which is connected between the wiring and the power supply voltage and whose gate receives a same signal as that being input into a gate of the precharge transistor.

6. A programmable logic array according to claim 4, wherein the precharge circuit is formed of an n-ch MOS transistor which is connected between the wiring and the power supply voltage and whose gate receives an inverted signal of a signal being input into a gate of the precharge transistor.

* * * * *